United States Patent
Sekiya

(10) Patent No.: US 10,153,836 B2
(45) Date of Patent: Dec. 11, 2018

(54) PROCESSING APPARATUS

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/715,937

(22) Filed: Sep. 26, 2017

(65) Prior Publication Data
US 2018/0097564 A1 Apr. 5, 2018

(30) Foreign Application Priority Data
Sep. 30, 2016 (JP) .................................. 2016-193730

(51) Int. Cl.
| H04B 10/00 | (2013.01) |
| H04B 10/114 | (2013.01) |
| G05B 19/418 | (2006.01) |
| H01L 21/67 | (2006.01) |
| H04J 14/00 | (2006.01) |
| G08C 23/04 | (2006.01) |

(52) U.S. Cl.
CPC ....... *H04B 10/1143* (2013.01); *G05B 19/418* (2013.01); *H01L 21/67* (2013.01); *H01L 21/67276* (2013.01); *H01L 21/67294* (2013.01); *G08C 23/04* (2013.01); *G08C 2200/00* (2013.01)

(58) Field of Classification Search
CPC ... H04B 10/11; H04B 10/114; H04B 10/1141; H04B 10/1143; H04B 10/1149
See application file for complete search history.

(56) References Cited

U.S. PATENT DOCUMENTS

2003/0101575 A1* 6/2003 Green .................. G08C 23/00
29/720
2003/0222587 A1* 12/2003 Dowling, Jr. ...... G06Q 30/0201
315/149

FOREIGN PATENT DOCUMENTS

| JP | 2014-235443 | 12/2014 |
| JP | 2014235443 A | * 12/2014 |

OTHER PUBLICATIONS

Machine Translation of JP2014/235443A, retreived Apr. 2, 2018.*

* cited by examiner

*Primary Examiner* — Daniel Dobson
(74) *Attorney, Agent, or Firm* — Greer Burns & Crain Ltd.

(57) ABSTRACT

A processing apparatus for processing a workpiece includes: a chuck table that holds the workpiece; a processing unit that processes the workpiece held by the chuck table; a controller that controls the chuck table and the processing unit; an input section that inputs a processing condition to the controller; a storage section that stores the processing condition inputted to the input section; and an infrared transmission/reception unit that transfers apparatus information between the processing apparatus and another processing apparatus by infrared radiation.

7 Claims, 7 Drawing Sheets

FIG.7A

| PACKET IDENTIFIER | ORIGIN ID (A) | DESTINATION ID (COMMON) | ORIGINAL APPARATUS ID (A) | DATA ID (001) | ERROR CORRECTION SIGN |

FIG.7B

| PACKET IDENTIFIER | ORIGIN ID (B) | DESTINATION ID (A) | ORIGINAL APPARATUS ID (A) | DATA ID (001) | RECEIVED (N) | ERROR CORRECTION SIGN |

FIG.7C

| PACKET IDENTIFIER | ORIGIN ID (A) | DESTINATION ID (B) | ORIGINAL APPARATUS ID (A) | DATA ID (001) | PACKET ID a/b (a,b:INTEGER) | DATA A-n | ERROR CORRECTION SIGN |

FIG.7D

| PACKET IDENTIFIER | ORIGIN ID (B) | DESTINATION ID (A) | ORIGINAL APPARATUS ID (A) | DATA ID (001) | PACKET ID a/b (a,b:INTEGER) | RECEIVED (OK) | ERROR CORRECTION SIGN |

FIG.7E

| PACKET IDENTIFIER | ORIGIN ID (B) | DESTINATION ID (COMMON) | ORIGINAL APPARATUS ID (A) | DATA ID (001) | ERROR CORRECTION SIGN |

PROCESSING APPARATUS

BACKGROUND OF THE INVENTION

Field of the Invention

The present invention relates to a processing apparatus for processing a workpiece.

Description of the Related Art

In a manufacturing process of a semiconductor device or an electronic part, a plate-shaped workpiece such as a semiconductor wafer and a ceramic substrate is thinned to a predetermined thickness by a grinding apparatus, and is thereafter divided into individual device chips by a cutting apparatus, a laser processing apparatus or the like. While these processing apparatuses are installed in a factory or the like, a plurality of the processing apparatuses are often aligned on the same floor in the factory or the like, with each processing apparatus being operated under a processing condition inputted by an operator. As the number of the processing apparatuses increases, the burden in inputting the processing condition by the operator is increased. In view of this, there has been proposed a processing apparatus wherein a processing condition is synchronized between a plurality of the processing apparatuses by transferring (transmitting and receiving) the processing condition between the plurality of processing apparatuses (see, for example, Japanese Patent Laid-open No. 2014-235443).

SUMMARY OF THE INVENTION

However, in the case where communication between a plurality of processing apparatuses is performed by wireless communication technology such as Wi-Fi (Wireless Fidelity) or Bluetooth (registered trademark), apparatus information such as the processing condition may be leaked. On the other hand, connection between the processing apparatuses by wired communication using cables or the like has problems in that it is difficult to add the processing apparatus and to change the layout of the processing apparatuses, and aesthetic appearance is damaged by the cables or the like.

Thus, there is a need for a processing apparatus permitting apparatus information to be transferred between a plurality of the processing apparatuses, without causing leakage of information.

In accordance with an aspect of the present invention, there is provided a processing apparatus including: a chuck table that holds a workpiece; processing means for processing the workpiece held by the chuck table; control means for controlling at least the chuck table and the processing means; input means for inputting and setting a processing condition to the control means; a storage section that stores apparatus information including the processing condition; and infrared transmission/reception means including a transmission section that transmits the apparatus information by infrared radiation, and a reception section that receives apparatus information transmitted from another processing apparatus by infrared radiation, wherein the apparatus information is transferred between the processing apparatuses by the infrared transmission/reception means.

According to this configuration, the apparatus information is automatically transferred between the plurality of processing apparatuses, so that the burden in inputting the apparatus information by the operator can be alleviated. In this case, since infrared communication is conducted between the plurality of processing apparatuses, the apparatus information of the processing apparatus is prevented from being leaked to outdoors at the time of communication. In addition, since wiring between the plurality of processing apparatuses is unnecessary, it is easy to add the processing apparatus and to change the layout of the processing apparatuses, and damaging of aesthetic appearance by cables can be obviated. Thus, apparatus information can be synchronized between a plurality of processing apparatuses, without causing leakage of information.

In the processing apparatus as above, the apparatus information is transferred between the plurality of processing apparatuses by relaying the apparatus information between the adjacent processing apparatuses.

According to the present configuration, apparatus information is transferred by infrared communication between a plurality of processing apparatuses, whereby the apparatus information can be transferred between the plurality of processing apparatuses, without causing leakage of information.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIGS. 7A to 7E are diagrams depicting an example of the infrared signal during communication in this embodiment.

DETAILED DESCRIPTION OF THE PREFERRED EMBODIMENT

Figure 1:
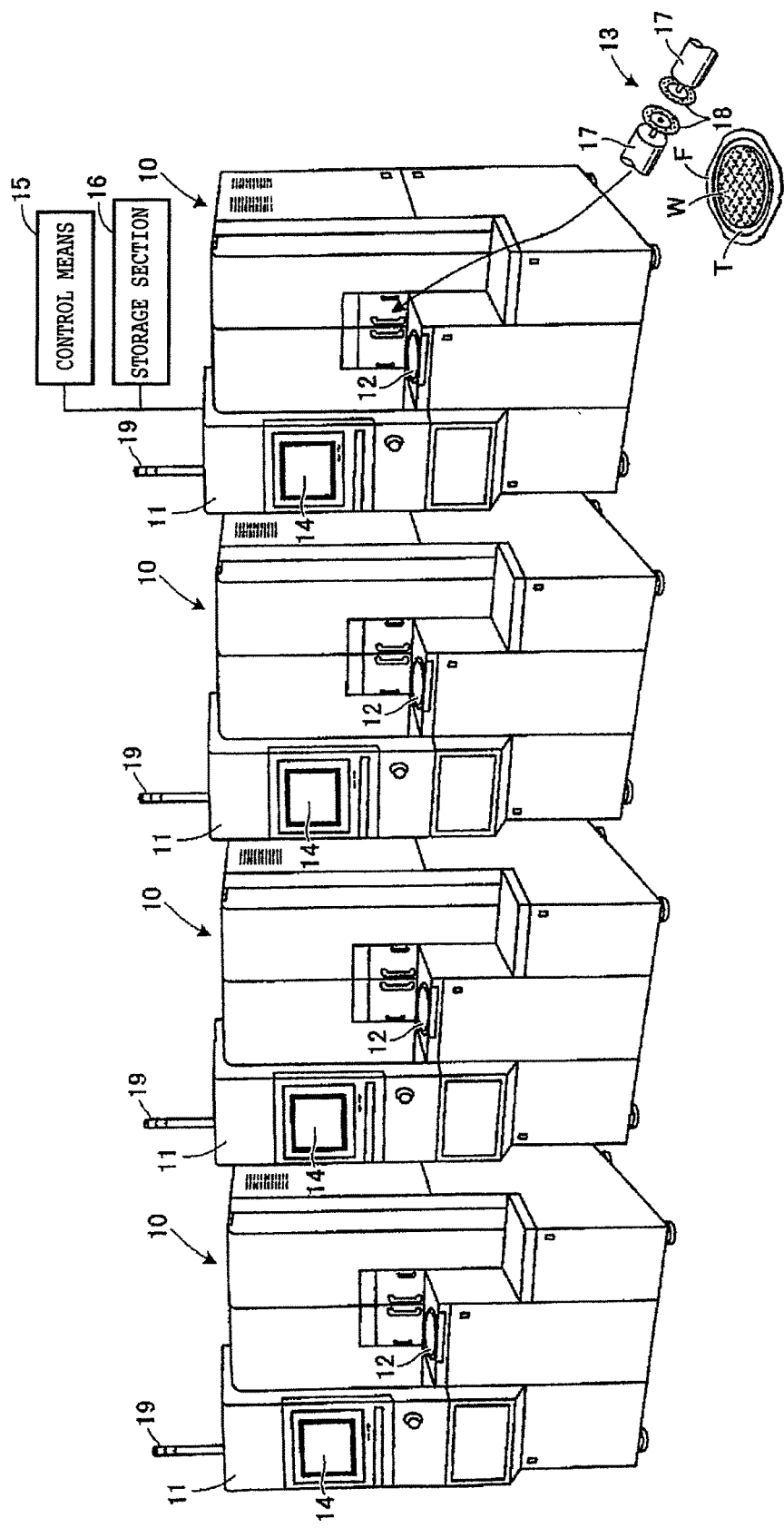
FIG. 1 is a perspective view of a processing apparatus according to an embodiment of the present invention.
Figure 2A:
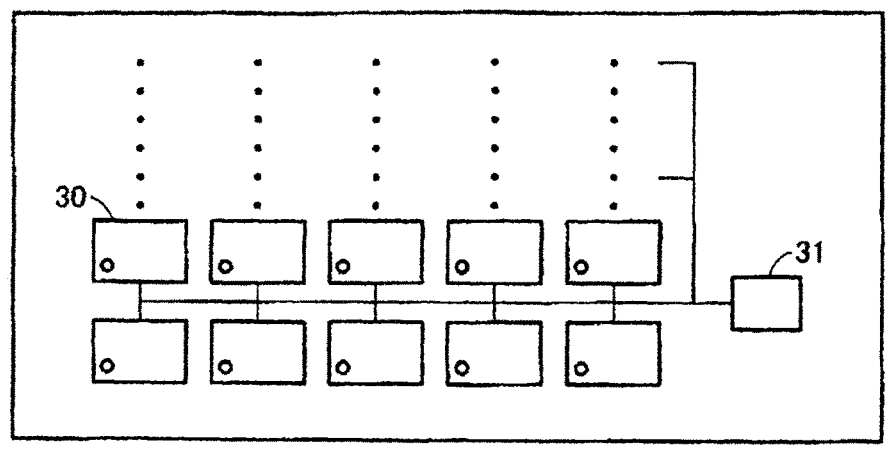
FIGS. 2A and 2B are schematic top views depicting layout examples of processing apparatuses according to comparative examples.
Figure 2B:
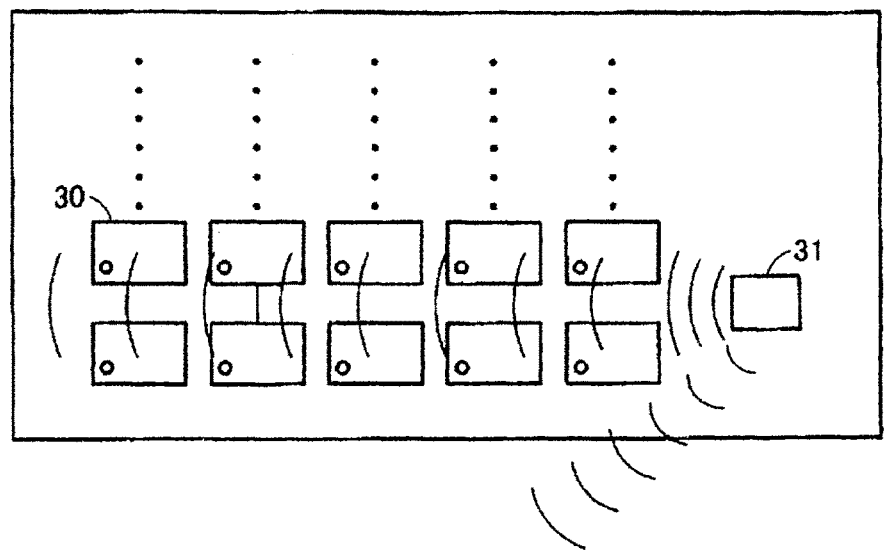

A processing apparatus according to an embodiment of the present invention will be described below, referring to the attached drawings. FIG. 1 is a perspective view of the processing apparatus according to this embodiment. FIGS. 2A and 2B are schematic top views depicting layout examples of processing apparatuses according to comparative examples. Note that while a cutting apparatus is depicted as an example of the processing apparatus in the description of this embodiment, the processing apparatus may be any apparatus that processes a workpiece, and may be, for example, a grinding apparatus, a polishing apparatus, a laser processing apparatus, or an etching apparatus.

As illustrated in FIG. 1, a processing apparatus 10 is configured to process a workpiece W held by a chuck table 12 by processing means 13 according to a processing condition inputted from a touch panel (input means) 14. The touch panel 14 is provided at an outer surface of a housing 11, and the processing condition and the like are set and inputted to control means 15 from the touch panel 14, whereby the chuck table 12 and the processing means 13 are controlled by the control means 15. In addition, apparatus information including the processing condition inputted from the touch panel 14 is stored in a storage section 16, and the control means (controller) 15 reads various kinds of apparatus information from the storage section 16, whereby the processing apparatus 10 is controlled in an integrated manner.

The control means 15 and the storage section 16 are configured using a processor for executing various processes, a memory and the like. The memory is included of one or a plurality of storing media, such as ROM (Read Only Memory) and RAM (Random Access Memory), according to the use. Besides, the chuck table 12 has a holding surface formed of a porous ceramic material, and the workpiece W is suction held by a negative pressure generated at the holding surface. The processing means 13 has a configuration wherein a cutting blade 18 at a tip of a spindle 17 is rotated at high speed in the housing 11, and the chuck table 12 is moved relative to the cutting blade 18, whereby the workpiece W is subjected to cutting.

A dicing tape T is adhered to a back surface of the workpiece W, and a ring frame F is attached to an outer periphery of the dicing tape T. Specifically, the workpiece W is fed to the processing apparatus 10 in the state of being supported on the ring frame F through the dicing tape T. The workpiece W may be a semiconductor wafer wherein semiconductor devices are formed on a semiconductor substrate, or may be an optical device wafer wherein optical devices are formed on an inorganic material substrate. Note that while an object to be processed by a cutting apparatus is depicted as an example of the workpiece W here, in the case of a processing apparatus other than a cutting apparatus the workpiece may be any one that can be an object to be processed by the other processing apparatus.

In addition, a display lamp 19 for indicating operating conditions of the apparatus is projectingly provided on an upper surface of the housing 11. The display lamp 19 is turned ON in green in a situation where the processing apparatus 10 is operating normally, and the display lamp 19 blinks in red in a situation where some trouble is generated in the processing apparatus 10. There is no obstacles other than the display lamp 19 on the upper surface of the housing 11, so that an operator can visually check the display lamp 19 from a remote position. In using the processing apparatus 10 configured as above, a processing condition is set and inputted manually through the touch panel 14 by the operator, whereby the operations of the chuck table 12 and the processing means 13 are controlled based on the processing condition.

Meanwhile, as depicted in comparative examples of FIGS. 2A and 2B, in general, a plurality of processing apparatuses 30 are aligned in a factory or the like, so that manual setting of apparatus information on the individual processing apparatuses 30 by the operator is burdensome. In view of this, methods for remotely setting apparatus information on a plurality of processing apparatuses 30 from a host computer 31 by wired communication or wireless communication have been investigated. In the case of wired communication, however, it is necessary to connect the processing apparatuses 30 by cables, so that it is difficult to add the processing apparatus 30 or to change the layout of the processing apparatuses (see FIG. 2A). In the case of wireless communication, on the other hand, electromagnetic waves low in directivity are propagated to outdoors while spreading, so that the apparatus information on the processing apparatuses 30 is leaked to the exterior (see FIG. 2B).

Returning to FIG. 1, a multiplicity of processing apparatuses 10 are closely arranged on the same floor of a factory or the like, and, usually, no obstacle that would interrupt communication is disposed between the adjacent processing apparatuses 10. Therefore, where communication is conducted between the processing apparatuses 10, there is no need for wireless communication by use of electromagnetic waves which are long in communication distance and low in directivity. In this embodiment, paying attention to the fact that the plurality of processing apparatuses 10 are closely arranged indoors, for example, in a factory, wireless communication is conducted between the processing apparatuses 10 by use of infrared radiation which is short in communication distance and high in directivity. It is difficult for the highly directive infrared radiation to be propagated to outdoors, so that apparatus information can be transferred between the plurality of processing apparatuses 10, without any leakage of information.

Besides, since the infrared communication is short in communication distance as aforementioned, infrared communication cannot be performed directly between the processing apparatuses 10 which are remote from each other. In view of this, in this embodiment, the apparatus information is relayed between the adjacent processing apparatuses 10, whereby transfer of the apparatus information between the remotely disposed processing apparatuses 10 is accomplished by way of a plurality of the processing apparatuses 10. This ensures that by only setting the apparatus information in one of the processing apparatuses 10, the apparatus information is relayed between the adjacent ones of the processing apparatuses 10 by infrared communication, whereby the same apparatus information can be synchronized in all the processing apparatuses 10 disposed on the same floor of the factory or the like.

Note that the apparatus information is not particularly restricted so long as it is information involved in the processing apparatus 10, and may include not only processing conditions such as device data but also blade-related information such as consumption of the cutting blade 18 (see FIG. 1). With the blade-related information stored in the plurality of processing apparatuses 10, it is possible, when the cutting blade 18 is dismounted from one processing apparatus 10 and thereafter mounted to another processing apparatus 10, to perform cutting by the another processing apparatus 10 while reflecting the consumption of the cutting blade 18.

Figure 3:
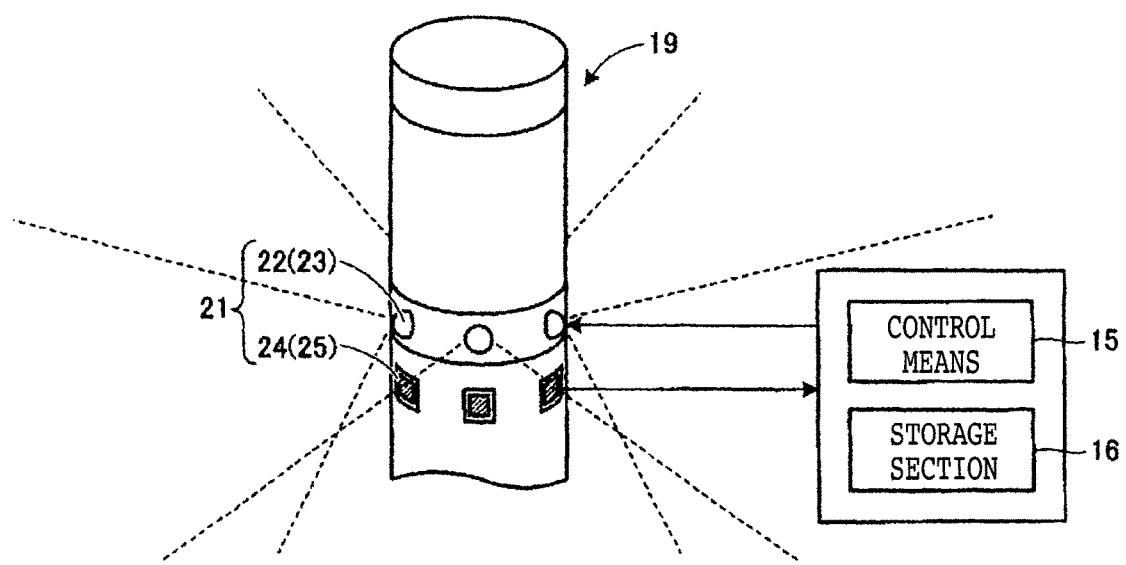
FIG. 3 is a schematic perspective view depicting an example of infrared transmission/reception means in this embodiment.
Figure 4:
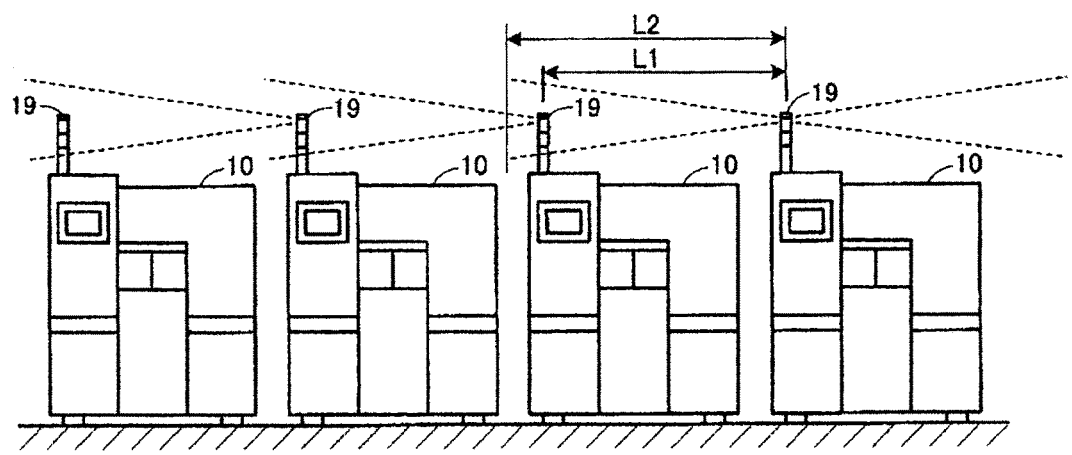
FIG. 4 is a schematic view depicting an example of infrared communication in this embodiment.

Now, referring to FIGS. 3 and 4, communication means for infrared communication that is provided in the processing apparatus will be described below. FIG. 3 is a schematic perspective view depicting an example of infrared transmission/reception means in this embodiment. FIG. 4 is a schematic view depicting an example of infrared communication in this embodiment.

As depicted in FIG. 3, infrared transmission/reception means 21 for infrared communication between the adjacent processing apparatuses 10 is provided on an outer peripheral surface of the display lamp 19 of the processing apparatus 10 (see FIG. 1). The infrared transmission/reception means 21 has a configuration wherein apparatus information is received from the storage section 16 and transmitted from a transmission section 22 by infrared radiation, and apparatus information transmitted from the transmission section 22 of another processing apparatus 10 by infrared radiation is received by a reception section 24. In this case, at the transmission section 22, various processings such as modulation are applied to the apparatus information, to convert the apparatus information into an infrared signal, and the infrared signal is transmitted. At the reception section 24, various processings such as demodulation are applied to the infrared signal, and the apparatus information is taken out.

In addition, the transmission section 22 has a plurality of infrared emission elements 23 arranged at regular intervals on an outer peripheral surface of the display lamp 19, so as to emit infrared radiation to the surroundings of the processing apparatus 10. Emission ranges (effective angles) of the infrared emission elements 23 partly overlap each other, and the infrared radiation is emitted in 360-degree directions to the surroundings of the display lamp 19. The reception section 24 has a plurality of infrared reception elements 25 arranged at regular intervals on the outer peripheral surface of the display lamp 19, so as to receive infrared radiations from the surroundings of the processing apparatus 10. Reception ranges (effective angles) of the infrared reception elements 25 partly overlap each other, and the infrared radiations are received in 360-degree directions from the surroundings of the display lamp 19.

As depicted in FIG. 4, a plurality of processing apparatuses 10 are arranged indoors in a factory or the like, and the interval L1 of the adjacent processing apparatuses 10, or the interval L1 of the display lamps 19, is set to be smaller than the reach distance L2 of the infrared radiation. In this case, since the infrared radiation reaches only between the adjacent processing apparatus 10, communication at each processing apparatus 10 is conducted in such a communication procedure that the apparatus information is sequentially relayed from one processing apparatus 10 to another, adjacent processing apparatus 10. Since the apparatus information is sequentially transferred between the plurality of processing apparatuses 10, by only setting the apparatus information in one of the processing apparatuses 10 it is possible to synchronize the apparatus information in all the processing apparatuses 10. Note that the details of the communication procedure by the processing apparatuses 10 will be described later.

Thus, in the processing apparatus 10 in this embodiment, the narrowness of the infrared emission range is covered by the plurality of infrared emission elements 23 (see FIG. 3) and the plurality of infrared reception elements 25 (see FIG. 3), and the shortness of the infrared communication distance is covered by the relay transmission by the plurality of processing apparatuses 10. In addition, only the display lamp 19 is projectingly provided on the upper surface of each processing apparatus 10, and there is no body there that would obstruct infrared communication. Therefore, the infrared radiation emitted from the infrared emission element 23 on the outer surface of each display lamp 19 is received by the infrared reception element 25 without being blocked, and the apparatus information can be favorably transferred between the adjacent processing apparatuses 10.

Figure 5:
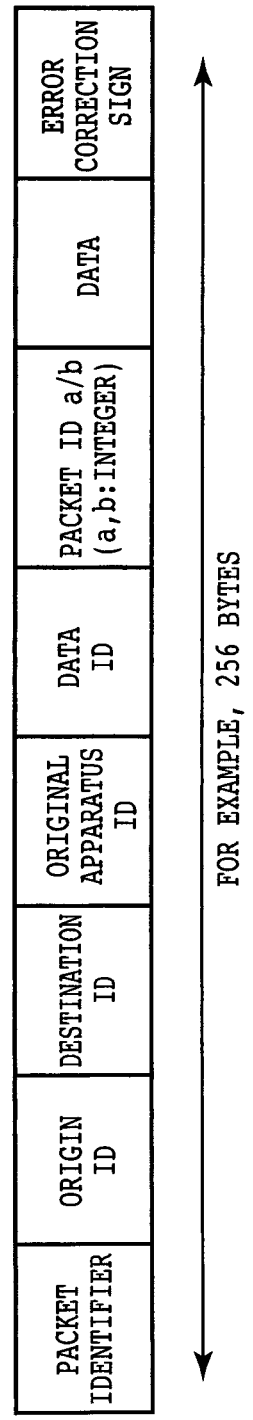
FIG. 5 depicts an example of data structure of an infrared signal in this embodiment.
Figure 6:
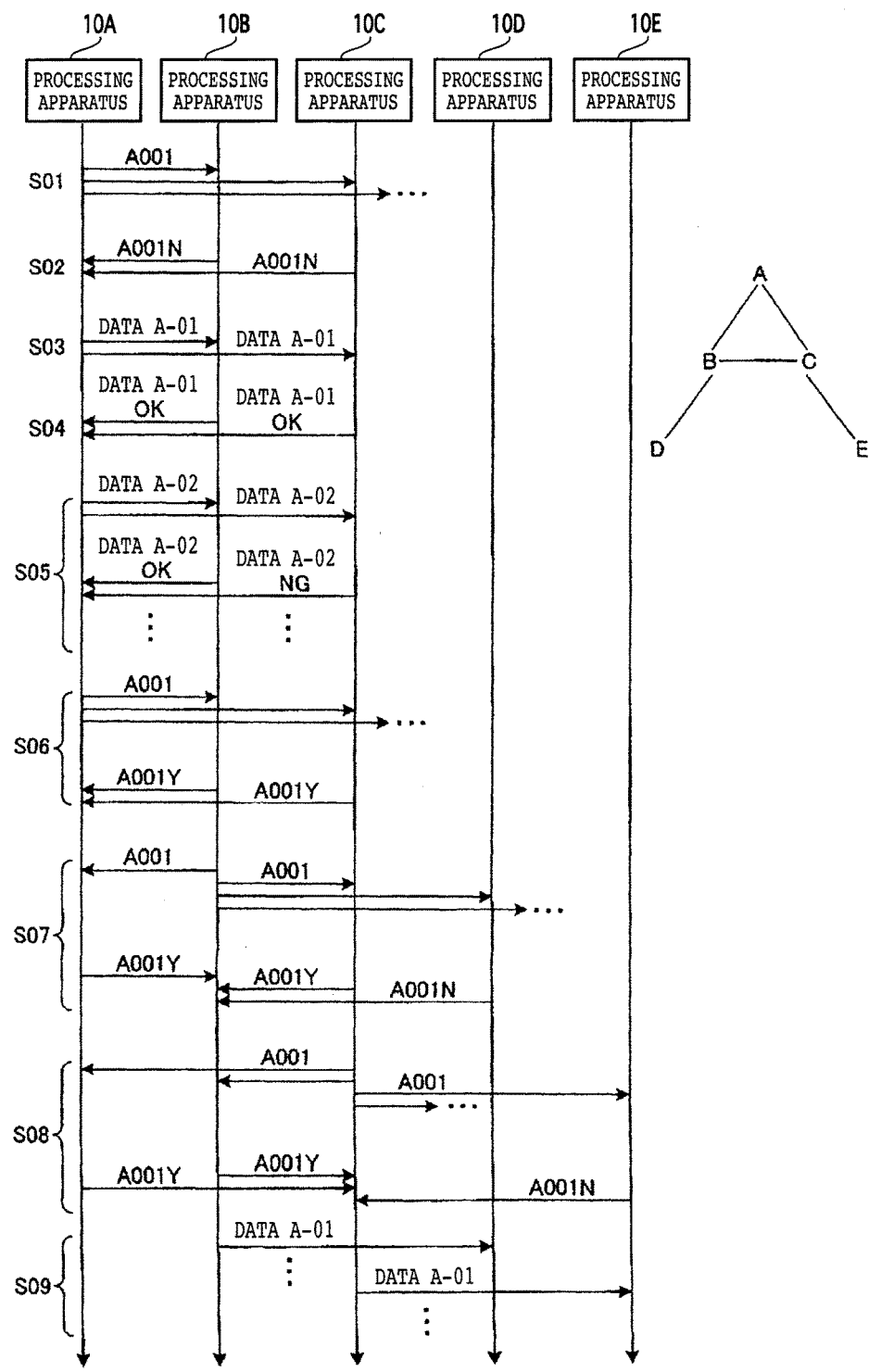
FIG. 6 depicts an example of a sequence diagram for a communication procedure in this embodiment.

Now, referring to FIGS. 5 to 7E, data structure of an infrared signal and a communication procedure by processing apparatuses will be described below. FIG. 5 depicts an example of the data structure of the infrared signal in this embodiment. FIG. 6 depicts an example of a sequence diagram for a communication procedure in this embodiment. FIGS. 7A to 7E depict an example of the infrared signal during communication in this embodiment. Note that FIG. 6 depicts an example of layout configuration of processing apparatuses, adjacently to the sequence diagram. In the layout configuration of processing apparatuses, infrared communication can be performed between the processing apparatuses connected to each other by a straight line.

Besides, the communication procedure and the data structure depicted below are mere examples, and other communication procedures and data structures may also be practiced so long as they permit transfer (transmission and reception) of apparatus information by infrared communication.

As depicted in FIG. 5, apparatus information is transmitted in the state of being divided into data packets of approximately 64 to 1,024 bytes. Each data packet is provided with a plurality of fields, in which a packet identifier, an origin identification (ID), a destination ID, an original apparatus ID, a data ID, a packet ID, and an error correction sign are set, in addition to the data of the apparatus information. The packet identifier indicates that the signal is a packet. The origin ID indicates the ID of an origin (transmission source), and the destination ID indicates the ID of a destination apparatus. The original apparatus ID indicates the ID of the apparatus that is the first origin (transmission source) of the apparatus information among the plurality of apparatuses.

The data ID indicates identification information of data, and is used to check whether or not apparatus information data is already stored in the destination apparatus. For instance, in the case where a processing condition is transmitted from an origin apparatus to a destination apparatus, in the destination apparatus it is decided from the data ID whether or not the same processing condition as that of the origin apparatus has been set. Therefore, repeated transmission of the same processing condition from the origin apparatus to the destination apparatus does not occur. Note that the data ID is managed on the basis of each apparatus, instead of central management by a host computer, so that uniqueness of data ID is secured by the original apparatus ID. The error correction sign is used for correction in the case where an error is generated in data.

As depicted in FIG. 6, when a processing condition is set in a processing apparatus 10A, a transmission packet including the processing condition is transmitted from the processing apparatus 10A to the surrounding processing apparatuses 10 in a broadcasting manner (Step S01). In the transmission packet, "001" is set as a data ID of the processing condition, an apparatus ID "A" of the processing apparatus 10A is set as an original apparatus ID, and "common ID" for broadcasting transmission is set as a destination ID (see FIG. 7A). In the following description, the data ID of the processing apparatus 10A as the original apparatus will be "A001." The data ID "A001" is received by the processing apparatuses 10B and 10C which are located within the reach range of infrared radiation from the processing apparatus 10A, but the data ID "A001" is not received by the processing apparatuses 10D and 10E which are located outside the reach range of infrared radiation.

Next, as a response to the broadcasting transmission, response packets indicative of whether or not the processing condition has already been received are replied from the processing apparatuses 10B and 10C to the processing apparatus 10A (Step S02). To the response packets, there is added a flag (in terms of Y/N) which indicates whether or not the processing condition has been received. Since the data designated by the data ID "A001" has been received by neither of the processing apparatuses 10B and 10C, the apparatus ID of the processing apparatus 10A is set as the destination ID and "N" is set as the flag in the response packets, indicating that the processing condition of the processing apparatus 10A has not yet been set (see FIG. 7B). Thus, the response packets indicative of that the processing condition has not yet been received are transmitted from the processing apparatuses 10B and 10C to the processing apparatus 10A.

Subsequently, the processing apparatus 10A waits for the response packets in response to the broadcasting transmission, and when the responses that the processing condition has not been received are received from the processing apparatuses 10B and 10C, data packets of the processing condition are transmitted from the processing apparatus 10A to the processing apparatuses 10B and 10C (Step S03). In the data packets, the apparatus ID "B" or "C" of the processing apparatus 10B or 10C is set as a destination ID, and "data A-n" is set as data (see FIG. 7C). As a result, data starting from "data A-01" are sequentially transmitted from the processing apparatus 10A toward the processing apparatuses 10B and 10C. Note that when the response that the processing condition has been received is sent to the processing apparatus 10A from one of the surrounding processing apparatuses 10, the data is not transmitted from the processing apparatus 10A to the response origin.

Next, as a response to the data transmission, response packets indicative of whether or not the data has been received are replied from the processing apparatuses 10B and 10C to the processing apparatus 10A (Step S04). To the response packets, there is added a flag (in terms of OK/NG) which indicates whether or not the data has been received. Since the data A-01 has appropriately been received by the processing apparatuses 10B and 10C, the apparatus ID of the processing apparatus 10A is set as the destination ID and "OK" is set as the flag in the response packets, indicating that the data A-01 has been received (see FIG. 7D). Thus, the response packets indicative of an affirmative response are transmitted from the processing apparatuses 10B and 10C to the processing apparatus 10A.

Subsequently, the processing apparatus 10A waits for response packets in response to the data transmission, and when response packets indicative of that the data have been received are received from the processing apparatuses 10B and 10C, next data packets are transmitted from the processing apparatus 10A to the processing apparatuses 10B and 10C (Step S05). Note that in the case where a response that the data has not been received is sent from the processing apparatus 10B or 10C or in the case where no response packet is sent from the processing apparatus 10B or 10C, the data packet is again sent from the processing apparatus 10A to the processing apparatus 10B or 10C. Such a data transmission and reception process is repeated, whereby the processing condition of the processing apparatus 10A is set in the processing apparatuses 10B and 10C.

When the processing condition of the processing apparatus 10A is set in the processing apparatuses 10B and 10C, a transmission packet including the processing condition is again transmitted from the processing apparatus 10A toward the surrounding processing apparatuses 10 in a broadcasting manner (Step S06). Since response packets that the transmission packet has been received are replied only from the processing apparatuses 10B and 10C, a transmitting and receiving process of the data of the processing condition of the processing apparatus 10A is not started. In addition, at the processing apparatus 10B also, the transmission packet including the processing condition of the processing apparatus 10A is transmitted in a broadcasting manner toward the surrounding processing apparatuses (Step S07, see FIG. 7E). To the processing apparatus 10B, response packets that the packet has been received are replied only from the processing apparatuses 10A and 10C, and a response packet that the packet has not been received is replied from the processing apparatus 10D.

Further, at the processing apparatus 10C also, a transmission packet including the processing condition of the processing apparatus 10A is transmitted in a broadcasting manner toward the surrounding processing apparatuses (Step S08). To the processing apparatus 10C, response packets that the packet has been received are replied only from the processing apparatuses 10A and 10B, and a response packet that the packet has not been received is replied from the processing apparatus 10E. Therefore, a transmitting and receiving process of the data of the processing condition of the processing apparatus 10A is started between the processing apparatuses 10B and 10D, and a transmitting and receiving process of the data of the processing condition of the processing apparatus 10A is started between the processing apparatuses 10C and 10E (Step S09). This operation is repeated, whereby the same processing condition is set in all the processing apparatuses 10A to 10E.

As has been described above, according to the processing apparatus 10 in this embodiment, the apparatus information is automatically transferred (transmitted and received) between the plurality of processing apparatuses 10, so that the burden involved in inputting the apparatus information by an operator can be alleviated. In this case, since infrared communication is performed between the plurality of processing apparatuses 10, the apparatus information on the processing apparatus 10 is prevented from leaking to outdoors at the time of communication. In addition, since wiring is not needed between the plurality of processing apparatuses 10, it is easy to add the processing apparatus 10 and to change the layout of the processing apparatuses 10, and damaging of aesthetic appearance by cables can be obviated. Thus, apparatus information can be synchronized between the plurality of processing apparatuses 10, without causing leakage of information.

Note that while the cutting apparatus has been depicted as the processing apparatus 10 in the description of this embodiment, this is not restrictive. The processing apparatus may be any apparatus that processes a workpiece, and may be, for example, a grinding apparatus, a polishing apparatus, a laser processing apparatus, or an etching apparatus. Therefore, the processing means is not limited to the cutting means, but may be any of grinding means, polishing means, laser processing means, and etching means. The chuck table is not restricted to the suction chuck type table, but may be an electrostatic chuck type table.

Besides, while the touch panel 14 has been depicted as the input means in the description of this embodiment, this configuration is not limitative. The input means may be any means by which a processing condition can be inputted and set to the control means of the processing apparatus, and the input means may be, for example, a pointing device such as a mouse or a track ball, or a character input device such as a keyboard.

In addition, while the transmission section 22 has the plurality of infrared emission elements 23 in this embodiment, this configuration is not restrictive. The transmission section may be any one that transmits apparatus information by infrared radiation, and the transmission section may have a single infrared emission element. Besides, while the reception section 24 has the plurality of infrared reception elements 25 in this embodiment, this configuration is not limitative. The reception section may be any one that receives apparatus information transmitted from the transmission section by infrared radiation, and the reception section may have a single infrared reception element.

In addition, while the apparatus information is relayed by the plurality of processing apparatuses 10 in this embodiment, this configuration is not restrictive. Where the number of the processing apparatuses is small, apparatus information may be transferred only between the adjacent processing apparatuses 10. Besides, while the embodiment and the modification have been described above, an overall or partial combination of the embodiment and the modification may be adopted as another embodiment of the present invention.

Besides, the embodiment of the present invention is not limited to the above-described embodiment, and various changes, substitutions or modifications may be made therein without departing from the gist of the technical thought of the present invention. Further, if the technical thought of the present invention can be embodied in other ways by the advance of technology or by another derived technology, the present invention may be carried out by the relevant method. Therefore, the appended claims cover all the embodiments that can fall within the scope of the technical thought of the present invention.

In addition, while a configuration wherein the present invention is applied to a processing apparatus has been described in the above embodiment, the present invention is applicable to various apparatuses wherein apparatus information can be synchronized between a plurality of apparatuses, without leakage of the apparatus information to outdoors, by infrared communication.

As has been described above, the present invention has an advantageous effect such that apparatus information can be transmitted between a plurality of apparatuses, without causing leakage of information, and is particularly useful for such an apparatus that a plurality of the apparatuses are aligned in a factory or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
    a chuck table that holds a workpiece, the chuck table being in a housing having an upper plate;
    processing means for processing the workpiece held by the chuck table;
    control means for controlling at least the chuck table and the processing means;
    input means for inputting and setting a processing condition to the control means;
    a storage section that stores apparatus information including the processing condition;
    a display lamp disposed outside the housing on an outside surface of the upper plate, the display lamp operating as an indicator means for indicating, with visible light, a status of at least one of the workpiece, the processing means, and the control means; and
    infrared transmission/reception means including a transmission section disposed on the display lamp that transmits the apparatus information by infrared radiation, and a reception section disposed on the display lamp that receives apparatus information transmitted from another processing apparatus by infrared radiation,
    wherein the apparatus information is transferred between the processing apparatuses by the infrared transmission/reception means.

2. The processing apparatus according to claim 1, wherein the apparatus information is transferred between a plurality of the processing apparatuses by relaying the apparatus information between the adjacent processing apparatuses.

3. The processing apparatus according to claim 1, wherein:
    the display lamp indicates the status of at least one of the workpiece, the processing means, and the control means by generating at least two different color lights corresponding to different statuses; and
    the upper surface of the housing only includes the display lamp.

4. The processing apparatus according to claim 1, wherein the transmission section has a plurality of infrared emission elements arranged at regular intervals on an outer peripheral surface of the display lamp, said infrared emission elements emitting infrared radiation to the surroundings of the processing apparatus.

5. The processing apparatus according to claim 4, wherein the infrared emission elements have emission ranges (effective angles) that partly overlap each other, and the infrared radiation is emitted in 360-degree directions to the surroundings of the display lamp.

6. The processing apparatus according to claim 1, wherein the reception section has a plurality of infrared reception elements arranged at regular intervals on an outer peripheral surface of the display lamp so as to receive, from the surroundings of the processing apparatus, the apparatus information transmitted from another processing apparatus by infrared radiation.

7. The processing apparatus according to claim 6, wherein the infrared reception elements have reception ranges (effective angles) that partly overlap each other, and the infrared radiations are received in 360-degree directions from the surroundings of the display lamp.

* * * * *